United States Patent [19]
Hardy et al.

[11] Patent Number: 6,114,982
[45] Date of Patent: Sep. 5, 2000

[54] SOURCE IMPEDANCE MATCHING IN AN ANALOG-TO-DIGITAL CONVERTER

[75] Inventors: Brett D. Hardy, Eden Prairie; Alan S. Fiedler, Minneapolis, both of Minn.

[73] Assignee: LSI Logic Corporation, Milpitas, Calif.

[21] Appl. No.: 09/105,702

[22] Filed: Jun. 26, 1998

[51] Int. Cl.[7] .................................................. H03M 1/36
[52] U.S. Cl. ......................... 341/159; 341/155; 341/118; 341/120
[58] Field of Search .................... 341/159, 155, 341/118, 120

[56] References Cited

U.S. PATENT DOCUMENTS

| | | | |
|---|---|---|---|
| 5,231,399 | 7/1993 | Gorman et al. | 341/159 |
| 5,731,776 | 3/1998 | Kumamoto et al. | 341/159 |
| 5,815,106 | 9/1998 | Poss et al. | 341/159 |
| 5,877,718 | 3/1999 | Andoh et al. | 341/155 |
| 5,990,707 | 11/1999 | Goldenberg et al. | 327/64 |

*Primary Examiner*—Brian Young
*Assistant Examiner*—Jason L W Kost
*Attorney, Agent, or Firm*—David D. Brush; Westman Champlin and Kelly

[57] ABSTRACT

An analog-to-digital (A/D) converter for converting an analog signal into a digital signal includes a first resistor ladder coupled between a first reference voltage and a second reference voltage. The A/D converter also includes a second resistor ladder that matches the first resistor ladder and that has a first end and a second end coupled to an analog signal source. The first resistor ladder and the second resistor ladder are coupled to at least two comparators with each comparator having a reference input and an analog input. The impedance at each reference input due to the first resistor ladder matches the impedance at each corresponding analog input due to the second resistor ladder.

18 Claims, 2 Drawing Sheets

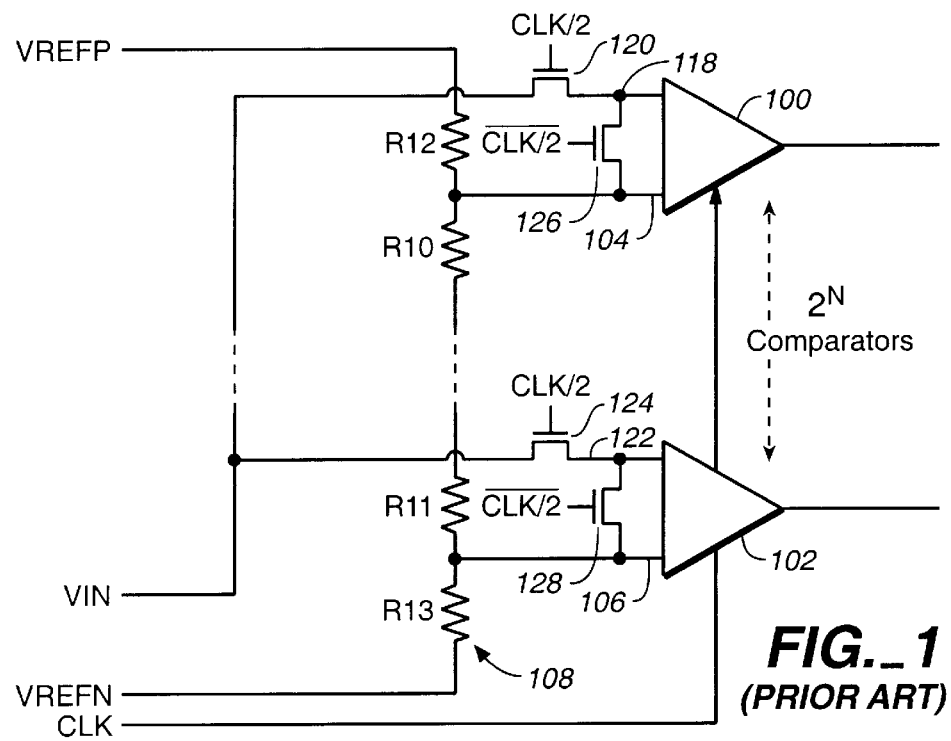
FIG._1
(PRIOR ART)
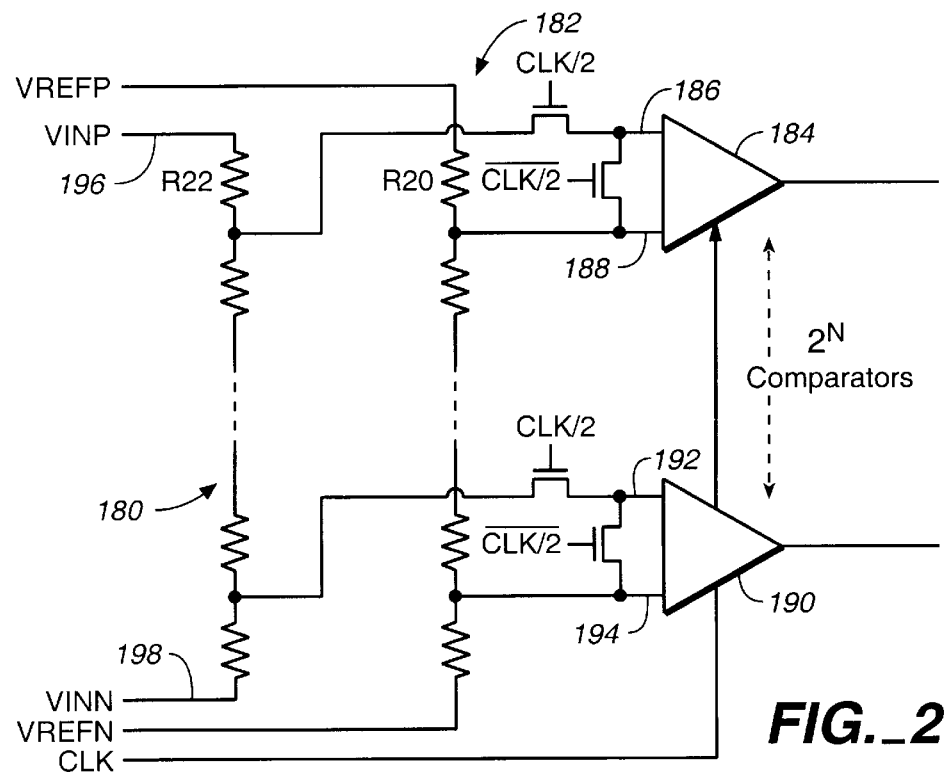
FIG._2

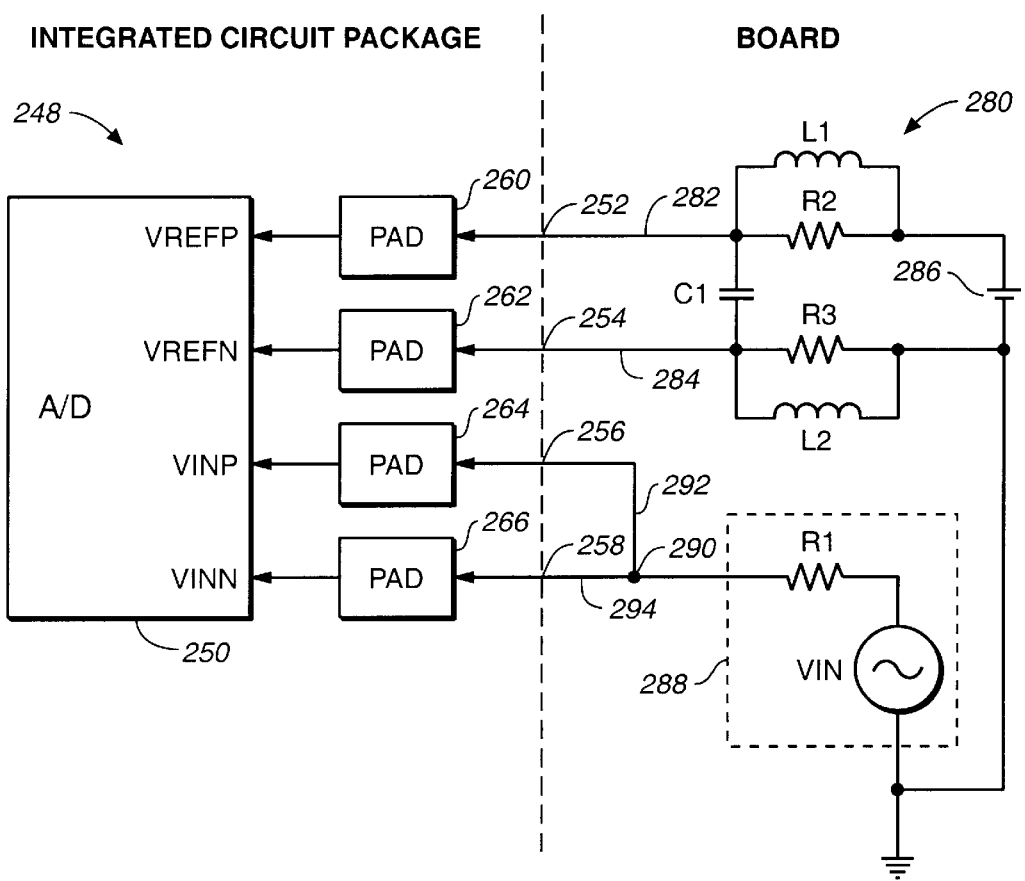
FIG._3

SOURCE IMPEDANCE MATCHING IN AN ANALOG-TO-DIGITAL CONVERTER

BACKGROUND OF THE INVENTION

The present invention relates to analog-to-digital converters. In particular, the present invention relates to resistor in analog-to-digital converters.

Analog-to-digital converters convert analog signals by sampling the signals and converting the samples into digital values. The sampling is performed by comparing the voltage of the analog signal against a set of reference voltages. Commonly, these reference voltages are produced using a resistor ladder consisting of a set of resistors of equal size connected in series between two reference potentials. The nodes between the resistors provide a set of voltages that are equally spaced between the upper reference potential and the lower reference potential.

In the prior art, the comparison between the input analog signal and the various voltages that are provided by the reference resistor ladder is accomplished using a plurality of comparators. Each comparator has one input coupled to a respective voltage node on the reference resistor ladder and a second input coupled to the analog input source that provides the analog signal. Since each comparator is connected to a different reference voltage, the output of the comparators will provide an indication of the voltage of the analog input signal.

Analog-to-digital converters of the prior art suffer from noise problems at the inputs to the comparators. Specifically, noise that is common to both inputs of a comparator can create a differential signal because of differences in the impedance attached to the inputs. The differences in the impedance seen by the inputs arise because one of the comparator inputs is coupled to the resistor ladder while the other input is coupled directly to the analog input source. If the differential signal created by the mismatch in resistor is larger than the smallest reference voltage on the reference resistor ladder, the analog-to-digital converter will generate the wrong digital value for the analog signal.

SUMMARY OF THE INVENTION

An analog-to-digital (A/D) converter for converting an analog signal into a digital signal includes a first resistor ladder coupled between a first reference potential and a second reference potential. The A/D converter also includes a second resistor ladder that matches the first resistor ladder and that has a first end and a second end coupled to an analog signal source that produces the analog signal. The first resistor ladder and the second resistor ladder are coupled to at least two comparators with each comparator having a reference input and an analog signal input. The impedance at each reference input due to the first resistor ladder matches the impedance at each corresponding analog signal input of a respective comparator due to the second resistor ladder.

BRIEF DESCRIPTION OF THE DRAWINGS

FIG. 1 is a circuit diagram of a prior art analog-to-digital converter.

FIG. 2 is a circuit diagram of an analog-to-digital converter of the present invention.

FIG. 3 is circuit diagram showing an additional aspect of an embodiment of the present invention.

DETAILED DESCRIPTION OF THE PREFERRED EMBODIMENTS

FIG. 1 is a circuit diagram of an analog-to-digital converter of the prior art. The analog-to-digital converter comprises $2^N$ comparators, where N is the number of bits in the digital word produced by the analog-to-digital converter. For example, if the analog-to-digital converter represents the value of the analog signal using six bits of a digital word, there would be 64 comparators in the analog-to-digital converter. For simplicity, only two of the comparators 100 and 102, representing the end comparators, are shown in FIG. 1.

Each of the $2^N$ comparators include a reference input, such as reference inputs 104 and 106 of comparators 100 and 102, that is connected to a reference resistor ladder 108. Reference resistor ladder 108 is coupled between an upper reference potential, VREFP, and a lower reference potential, VREFN. Reference resistor ladder 108 includes a series of resistors with one resistor between each of the reference inputs of the $2^N$ comparators. Typically, each resistor has the same resistance value. Thus, resistor R10, which is connected between reference input 104 and the reference input of another comparator (not shown), has the same resistance as resistor R11, which is connected between reference input 106 and the reference input of an additional comparator (also not shown). Those skilled in the art will recognize that the dotted portion of resistor ladder 108 includes one resistor between each of the reference inputs of the comparators that are not shown.

Resistor ladder 108 also includes two end resistors, R12 and R13, which are located on separate ends of the resistor ladder. Commonly, each end resistor provides one-half the resistance of each of the other resistors in the resistor ladder. Thus, resistor R12 provides one-half the resistance of resistor R10.

Since the interior resistors of resistor ladder 108 are equal to each other, the voltages at each of the reference inputs are evenly distributed between the upper reference potential VREFP and the lower reference potential VREFN. For example, for a grounded lower reference potential, if the analog-to-digital converter of FIG. 1 has 64 comparators, the voltage at reference input 106 is equal to 1/128 times the upper reference potential. Each of the other 63 reference inputs will have a voltage that is an odd integer multiple of the voltage at reference input 106. Thus, the reference input above reference input 106 has a voltage that is three times the voltage at reference input 106. The maximum voltage of such a comparator is found at reference input 104, which is at a voltage that is 127 times as large as the voltage at reference input 106.

In the prior art example of FIG. 1, each of the $2^N$ comparators also has an analog input that is connected to an analog signal source through an analog input switch. For example, comparator 100 has an analog input 118 that is connected to an analog signal source, VIN, through an analog input switch 120. Similarly, comparator 102 has an analog input 122 connected through an analog input switch 124 to analog signal source VIN.

All of the analog input switches connected to the respective analog inputs of the $2^N$ comparators are controlled by the same timing signal denoted as CLK/2 in FIG. 1. Thus, all of these switches open and close together. When the switches are closed, the analog signal at analog signal source VIN is provided to the analog inputs of the comparators, which compare the voltage of the analog signal to the voltage at the comparators' respective reference inputs. Because each of the reference inputs of the $2^N$ comparators are at a different but equally spaced voltage between VREFP and VREFN, each comparator compares a different voltage against the analog input signal. Based on this comparison, each comparator produces a binary output indicative of the comparison.

When the analog input switches are open, a second set of shorting switches that connect the respective reference inputs to the respective analog inputs are closed. For example, shorting switch 126 connects analog input 118 to reference input 104. Similarly, shorting switch 128 connects analog input 122 to reference input 106. Each of the shorting switches is controlled by $\overline{\text{CLK/2}}$, which is the complement of CLK/2.

Together, the analog input switches and shorting switches provide an "auto-zeroing" function for the analog-to-digital converter. Preferably, the switches change state at one-half the comparator sampling rate. Thus, in FIG. 1, the clocking signal, CLK, for the comparators is twice the frequency of the switching signals CLK/2 and $\overline{\text{CLK/2}}$.

Note that when the analog input switches are closed, the analog inputs and the reference inputs of the $2^N$ comparators connect to different impedances. In particular, the reference inputs of the comparators connect to the impedance of resistor ladder 108 and the impedance associated with the upper and lower reference sources. The analog inputs, on the other hand, connect only to the analog input source impedance. Because the analog and reference inputs connect to different impedances, a noise signal common to both the analog input and the reference input of a comparator will generate different voltages at the respective inputs. Thus, in prior art analog-to-digital converters, common mode noise can induce a differential signal at the comparator inputs.

To overcome this prior art problem, the present invention, as shown in FIG. 2, includes analog input resistor ladder 180 that matches reference resistor ladder 182. Specifically, matching analog input resistor ladder 180 is connected to the analog inputs of $2^N$ comparators of the analog-to-digital converter of FIG. 2.

Analog input resistor ladder 180 matches reference resistor ladder 182 in that each resistor in reference resistor ladder 182 is matched to a corresponding resistor in analog input resistor ladder 180. Thus, end resistor R20, which is part of reference resistor ladder 182 and which is connected between VREFP and reference input 188 of comparator 184, should have the same resistance value as resistor R22, which is located within analog input resistor ladder 180 between analog input pin VINP and analog input 186 of comparator 184.

Because analog input resistor ladder 180 matches reference resistor ladder 182, the impedance at analog input 186 of comparator 184 matches the impedance at reference input 188 of comparator 184. Similarly, for each of the $2^N$ comparators, the impedance at its analog input due to analog resistor ladder 180 matches the impedance at its reference input due to reference resistor ladder 182.

A first end 196 and a second end 198 of analog input resistor ladder 180 are connected to VINP and VINN, respectively, which represent input pins on the analog-to-digital converter of FIG. 2. VINP and VINN are connected to the same analog input source. Because the same analog input signal is provided at both ends of analog input resistor ladder 180, the entire ladder has the same voltage as the analog input signal. Thus, the comparison functions of the analog-to-digital converter of FIG. 2 operate in the same manner as the comparison functions described for the prior art analog-to-digital converter of FIG. 1.

In addition to selecting identical resistive devices for both ladders, the layout of the analog-to-digital converter is preferably controlled so that analog input resistor ladder 180 has a substantially identical layout to reference resistor ladder 182. As those skilled in the art will recognize, the common-mode noise rejection will improve as the circuit layout of the two resistors ladders 180 and 182 become more similar.

While matching the impedance of reference resistor ladder 182, analog input resistor ladder 180 should not attenuate the analog input signal. Specifically, analog input resistor ladder 180 should be constructed so that its parasitic capacitance does not significantly attenuate the analog input signal at frequencies of interest.

Note that, as in FIG. 1, only the relevant portions of the analog-to-digital converter are shown in FIG. 2. Specifically, the components used to convert the comparator outputs into digital words are not shown since they are known in the art and are not relevant to the present invention.

FIG. 3 is a circuit diagram showing further aspects of preferred embodiments of the present invention. In FIG. 3, the analog-to-digital converter of FIG. 2 is shown as a chip 250, which forms part of an integrated circuit package 248. Those skilled in the art will recognize that integrated circuit package 248 has a large number of input and output pins. However, for simplicity, FIG. 3 only shows the four pins that are significant to the present invention. Specifically, FIG. 3 includes upper reference potential pin 252, lower reference potential reference pin 254, upper analog input pin 256, and lower analog input pin 258.

Pins 252 and 254 are connected to two pads 260 and 262 on integrated circuit package 248. The signals connecting to pads 260 and 262 are represented in FIGS. 2 and 3 as VREFP, the upper reference potential and VREFN, the lower reference potential. Analog input pins 256 and 258 are connected to pads 264 and 266 of integrated circuit package 248. The signals provided on pads 264 and 266 are represented in FIGS. 2 and 3 as VINP and VINN, respectively.

In the preferred embodiment of FIG. 3, pins 252, 254, 256, and 258 make electrical connections to conductors on circuit board 280. Pins 256 and 258 connect to conductive traces 292 and 294, respectively, which are connected together at a node 290. Node 290 is further connected to an analog input source 288 that is shown as the combination of an ideal analog source VIN in series with resistor R1. Through these connections, pads 264 and 266 are able to deliver the analog input signal produced by analog input source 288 to both sides of analog input resistor ladder 180 of FIG. 2.

Pins 252 and 254 are connected to conductive traces 282 and 284, which are further connected to resistors R2 and R3, respectively. Resistor R3 has a second terminal connected to ground and also to one end of precision reference source 286. A second terminal of resistor R2 is connected to the second terminal of precision reference source 286, which provides a reference voltage relative to ground. To avoid a direct current (DC) drop across resistors R2 and R3, inductor L1 is placed in parallel with resistor R2 and inductor L2 is placed in parallel with resistor R3. Inductors L1 and L2 are preferably large enough that at DC, both inductors operate as short circuits and at frequencies in the Megahertz range, both inductors operate as open circuits. Through these connections, pins 252 and 254 are able to provide upper reference potential VREFP to one side of reference resistor ladder 182 and lower reference potential VREFN to a second side of reference resistor ladder 182, respectively.

Resistors R2 and R3 are added to the present invention to match the intrinsic source impedance, R1, of analog input source 288. Without resistors R2 and R3, the reference inputs of the comparators of FIG. 2 would see a different impedance than the corresponding analog inputs even though analog resistor ladder 180 matches reference resistor ladder 182.

In addition, to match the impedance of the conduction path created by the connection between conductive traces 292 and 294 at node 290, the present invention uses a capacitor C1 connected between analog input pins 252 and 254. Capacitor C1 is large enough that at the signal frequencies of interest it appears as a short circuit. Thus, at these frequencies, resistors R2 and R3 are viewed as being in parallel with each other. Therefore, to match source impedance R1 of analog input source 288, it is preferred that resistors R2 and R3 both be equal to twice the resistance of source impedance R1. Although the source impedance R1 of analog input source 288 has been shown as a discrete element, those skilled in the art will recognize that this impedance includes the impedance inherent in the traces between the analog input source and node 290.

Through the impedance matching of analog input resistor ladder 180 to reference resistor ladder 182, as well as the impedance matching of source impedance R1 to the resistance of R2 and R3 in parallel, the present invention is able to reduce differential signals induced by common-mode noise at the inputs of comparators of an analog-to-digital converter. Although the two types of matching discussed above are preferably practiced together, those skilled in the art will recognize that the resistor ladder matching can be practiced without the source impedance matching.

Although the present invention has been described with reference to preferred embodiments, workers skilled in the art will recognize that changes may be made in form and detail without departing from the spirit and scope of the invention.

What is claimed is:

1. An analog-to-digital converter for converting an analog signal from an analog signal source into a digital signal, the analog-to-digital converter comprising:

a first impedance ladder having a first end coupled to receive an upper reference voltage and a second end coupled to receive a lower reference voltage;

a second impedance ladder that matches the first impedance ladder and that has a first end and a second end coupled to the analog signal source;

at least two comparators, each comparator having a reference input and an analog input, the impedance at each comparator's reference input due to the first impedance ladder matching the impedance at each comparator's corresponding analog input due to the second impedance ladder.

2. The analog-to-digital converter of claim 1 wherein the first end and the second end of the second impedance ladder are connected together at a connection node.

3. The analog-to-digital converter of claim 2 further comprising a shorting capacitor coupled between the first end and the second end of the first impedance ladder.

4. The analog-to-digital converter of claim 3 wherein the shorting capacitor and the connection node are substantially the same distance from at least one of the comparators.

5. The analog-to-digital converter of claim 1 wherein the analog source comprises an analog source resistance and wherein the analog-to-digital converter further comprises a first resistance coupled between an upper reference potential source and the first end of the first impedance ladder and a second resistance coupled between a lower reference potential source and the second end of the first impedance ladder.

6. The analog-to-digital converter of claim 5 wherein the first resistance and the second resistance each provide twice the resistance of the analog source resistance.

7. The analog-to-digital converter of claim 5 further comprising a first inductor in parallel with the first resistance, and a second inductor in parallel with the second resistance.

8. A method of matching impedance in an analog-to-digital converter having a plurality of comparators, each comparator having a reference input coupled to a reference impedance ladder, the method comprising:

coupling an analog input of each comparator to an input impedance ladder having a first end and a second end such that the impedance at each analog input due to the input impedance ladder matches the corresponding impedance at the reference input of each comparator due to the reference impedance ladder;

coupling the first end of the input impedance ladder to an input signal source; and coupling the second end of the input impedance ladder to the input signal source.

9. The method of claim 8 wherein the first end of the input impedance ladder is connected to the second end of the input impedance ladder at an input node that is further connected to the input signal source.

10. The method of claim 9 further comprising coupling a shorting capacitor between a first end and a second end of the reference impedance ladder.

11. The method of claim 10 wherein the shorting capacitor and the input node are substantially the same distance from a comparator.

12. The method of claim 8 further comprising:

coupling a first impedance between a first reference voltage and a first end of the reference impedance ladder; and coupling a second impedance between a second reference voltage and a second end of the reference impedance ladder, the first impedance and the second impedance together forming a parallel resistance substantially equal to a resistance of the input signal source.

13. An analog-to-digital converter for converting an analog signal from an analog signal source into a digital signal, the analog-to-digital converter comprising:

a first impedance ladder having a first end coupled to receive an upper reference potential and a second end coupled to receive a lower reference potential; and a second impedance ladder that matches the first impedance ladder and that has a first end and a second end coupled to the analog signal source.

14. The analog-to-digital converter of claim 13 further comprising a first impedance coupled between the upper reference potential source and the first end of the first impedance ladder.

15. The analog-to-digital converter of claim 14 wherein the total resistance for the input signal source equals one-half the resistance of the first impedance.

16. The analog-to-digital converter of claim 14 further comprising an inductor coupled in parallel with the first impedance.

17. The analog-to-digital converter of claim 13 wherein the first impedance ladder comprises a series of resistors.

18. The analog-to-digital converter of claim 13 wherein the first end and the second end of the first impedance ladder are coupled together by a capacitor.

* * * * *